(12) United States Patent
Chang

(10) Patent No.: US 7,759,691 B2
(45) Date of Patent: Jul. 20, 2010

(54) LIGHT EMITTING DIODE AND MANUFACTURING METHOD THEREOF

(75) Inventor: Chia-Shou Chang, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/241,064

(22) Filed: Sep. 30, 2008

(65) Prior Publication Data

US 2010/0001310 A1    Jan. 7, 2010

(30) Foreign Application Priority Data

Jul. 4, 2008    (CN)    ......................... 2008 1 0068324

(51) Int. Cl.
*H01L 33/00*    (2010.01)
(52) U.S. Cl. ................................. 257/100; 257/E33.059
(58) Field of Classification Search .................. 257/79, 257/100
See application file for complete search history.

(56) References Cited

U.S. PATENT DOCUMENTS

| | | | |
|---|---|---|---|
| 7,282,853 B2 * | 10/2007 | Yano et al. | 313/498 |
| 2008/0089053 A1 * | 4/2008 | Negley | 362/84 |

* cited by examiner

*Primary Examiner*—W. David Coleman
*Assistant Examiner*—Christine Enad
(74) *Attorney, Agent, or Firm*—Frank R. Niranjan

(57) ABSTRACT

An exemplary light emitting diode (LED) includes a substrate, a LED chip and an encapsulation unit. The encapsulation unit includes a first encapsulation material located over the LED chip and a second encapsulation material located around the first encapsulation material. A plurality of first particles with a first distributing density is distributed in the first encapsulation material. A plurality of second particles with a second distributing density is distributed in the second encapsulation material. The first distributing density is larger than the second distributing density, a central portion of light from the light emitting diode chip transmits through the first encapsulation material and exits the encapsulation unit from a top surface thereof, and a periphery portion of light from the light emitting diode chip transmits through the second encapsulation material and exits the encapsulation unit from the top surface thereof.

12 Claims, 4 Drawing Sheets

LIGHT EMITTING DIODE AND MANUFACTURING METHOD THEREOF

BACKGROUND

1. Field of the Invention

The present invention relates to a light emitting diode and a manufacturing method thereof.

2. Description of Related Art

Currently, LEDs (light emitting diode) are preferred for use in non-emissive display devices rather than CCFLs (cold cathode fluorescent lamp) due to their high brightness, long lifespan, and wide color range.

A related light emitting diode (LED) includes a LED chip and an encapsulation material encapsulating the LED chip therein. The encapsulation material has a planar top surface as a light output surface. In operation, light emitted from the LED chip shoots towards the encapsulation material, and leaves the LED from the light output surface of the encapsulation material.

It is known that a majority of light from the LED chip travels towards a central area of the light output surface. The light is directly refracted by the light output surface of the encapsulation material, whose smooth nature can not help the majority of light to be dispersed to a periphery area of the light output surface to satisfy a requirement of uniform light illumination, without glare. Thus, the majority of the light emitted from the LED chip leaves the LED from the encapsulation material as a beam, which causes the periphery area of the light output surface to be darker than the central area thereof, thereby preventing a uniform distribution of light over the light output surface.

It is thus desired to provide a LED which can overcome the described limitations.

SUMMARY

The present invention relates to a light emitting diode. According to an exemplary embodiment of the present invention, the light emitting diode includes a substrate, a light emitting diode chip mounted on the substrate, and an encapsulation unit. The encapsulation unit is disposed on the substrate and encapsulates the light emitting diode chip therein. The encapsulation unit includes a first encapsulation material located adjacent to the light emitting diode chip and a second encapsulation material located around the first encapsulation material. A plurality of first particles with a first distributing density is distributed in the first encapsulation material. A plurality of second particles with a second distributing density is distributed in the second encapsulation material. The first distributing density is larger than the second distributing density. A central portion of light from the light emitting diode chip transmits through the first encapsulation material and exits the encapsulation unit from a top surface of the encapsulation unit. A periphery portion of light from the light emitting diode chip transmits through the second encapsulation material and exits the encapsulation unit from the top surface of the encapsulation unit.

The present invention relates, in another aspect, to a method of manufacturing a light emitting diode. According to an exemplary embodiment of the present invention, the light emitting diode includes a substrate, a light emitting diode chip and an encapsulation unit. The substrate defines a receiving recess therein. The encapsulation unit disposed in the receiving recess and encapsulating the light emitting diode chip in the receiving recess. The encapsulation unit has a first encapsulation material and a second encapsulation material. The first encapsulation material is located over to the light emitting diode chip and the second encapsulation material is located around the first encapsulation material. The method includes the following steps: providing a mold which has a same configuration as the second encapsulation material, putting the mold in the receiving recess to occupy a first space of the receiving recess, and injecting a first mixture of a transparent colloid and a plurality of first particles into the receiving recess to fill a remaining second space of the receiving recess; solidifying the first mixture to form the first encapsulation material with the first particles distributed in the first encapsulation material with a first distributing density; removing the mold out of the receiving recess, and injecting a second mixture of a transparent colloid and a plurality of second particles into the first space of the receiving recess formed after the mold is removed out of the receiving recess; and solidifying the second mixture to form the second encapsulation material with the second particles distributed in the second encapsulation material with a second distributing density which is smaller than the first distributing density.

Other advantages and novel features of the present invention will become more apparent from the following detailed description of embodiment when taken in conjunction with the accompanying drawings.

DETAILED DESCRIPTION OF THE EMBODIMENTS

Reference will now be made to the drawings to describe the various present embodiments in detail.

Figure 1:
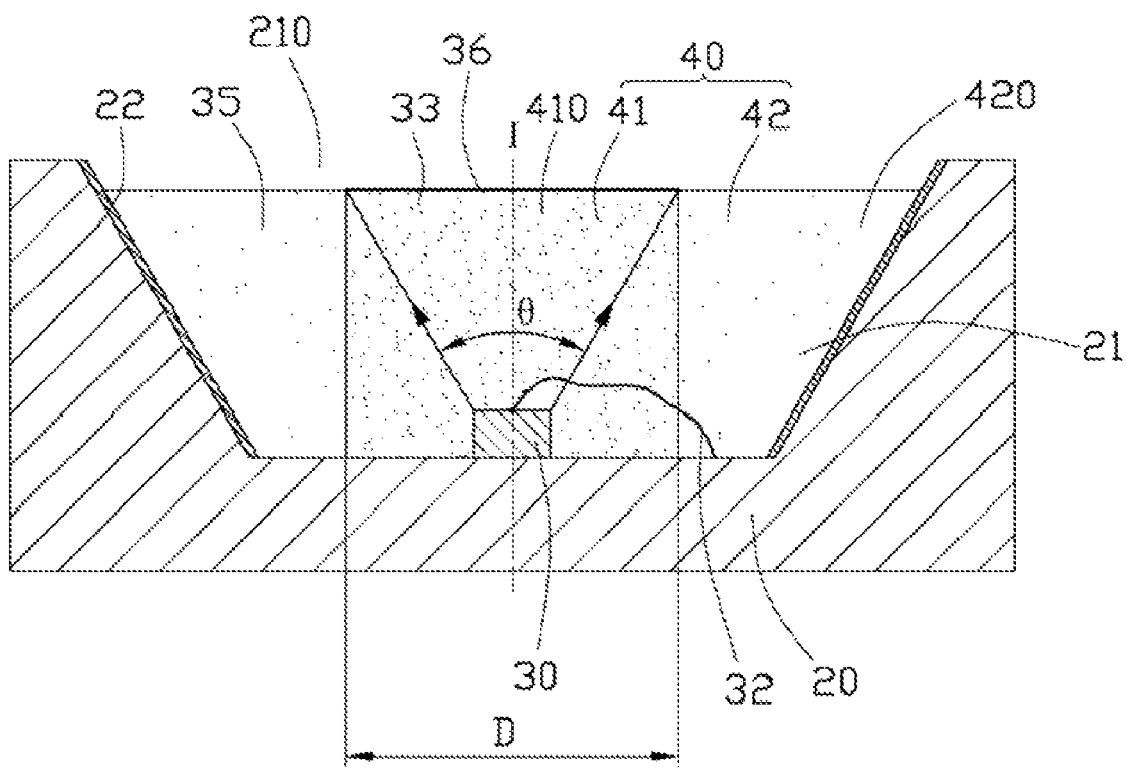
FIG. 1 is a cross-section of a light emitting diode in accordance with a first exemplary embodiment of the present invention.

Referring to FIG. 1, a light emitting diode (LED) 10 includes a substrate 20, a LED chip 30, and an encapsulation unit 40.

The substrate 20 defines a receiving recess 21 therein. The receiving recess 21 is concaved downwardly from a top surface of the substrate 20 towards a bottom surface of the substrate 20. The receiving recess 21 is bowl-shaped, and includes a bottom face paralleled to the top surface of the substrate 20 and an annular side face extending upwardly and outwardly from the bottom face towards the top surface of the substrate 20. A reflecting layer 22 is formed on the annular side face of the receiving recess 21 for reflecting light generated by the LED chip 30 and incident thereon towards a top opening 210 of the receiving recess 21. The LED chip 30 is electrically connected to the substrate 20 via a gold wire 32.

The encapsulation unit 40 includes a first encapsulation material 41 and a second encapsulation material 42. Each of the first and the second encapsulation materials 41, 42 is of transparent, light penetrable material, which is selected from one of epoxy resin, silicone and polymethylmethacrylate.

The first encapsulation material 41 is column shaped. The first encapsulation material 41 receives the LED chip 30 at a bottom end thereof. A diameter of the first encapsulation material 41 equals to the diameter D of a light spot 36, which is defined by a majority of light from the LED chip 30 projected onto a top surface of the encapsulation unit 40. The LED chip 30 generally generates a diffusion-type light field. A radiation angle of the light field is between left 60° and right 60° with respect to a central axis I of the LED chip 30. In this embodiment, the LED chip 30 is located on a center of the bottom end of the first encapsulation material 41, and the majority of light from the LED chip 30 is located in a central radiation angle θ of between left 30° and right 30° with respect to the central axis I. Accordingly, the light spot 36 is defined by the light field within the central radiation angle θ of between left 30° and right 30° with respect to the central axis I of the LED chip 30. A plurality of first particles 410 having a first distributing density are distributed in the first encapsulation material 41.

The second encapsulation material 42 is located around the first encapsulation material 41, and tightly contacts with a circumferential surface of the first encapsulation material 41. The second encapsulation material 42 and the first encapsulation material 41 cooperatively form the encapsulation unit 40. The encapsulation unit 40 has a same configuration as the receiving recess 21 of the substrate 20. A plurality of second particles 420 having a second distributing density are distributed in the second encapsulation material 42. The distributing density of the particles 420 of the second encapsulation material 42 is smaller than that of the particles 410 of the first encapsulation material 410; that is, the second distributing density is smaller than the first distributing density. A particle diameter of each of the particles 410, 420 equals to or is larger than a wavelength of the light from the LED chip 30. In this embodiment, the particles 410, 420 are fluorescent powders.

In operation, the majority of light from the LED chip 30 emits towards a central area 33 of the encapsulation unit 40, and a minority of light from the LED chip 30 emits towards a periphery area 35 of the encapsulation unit 40. All of the light from the LED chip 30 finally transmits through the encapsulation unit 40 and exits out of the encapsulation unit 40 from the top opening 210 of the receiving recess 21.

Since the first encapsulation material 41 is located at the central area 33 of the encapsulation unit 40 and is more closer to the LED chip 30 than the second encapsulation material 42, the majority of light from the LED chip 30 which is located at a center of the light is transmitted through the first encapsulation material 41, and the minority of light from the LED chip 30 which is located at a periphery of the light is transmitted through the second encapsulation material 42. The distributing density of the particles 410 in the first encapsulation material 41 is larger than the distributing density of the particles 420 in the second encapsulation material 42. Thus, the chance of the majority of the light incident on and reflected by the particles 410 of the first encapsulation material 41 is lager than that of the minority of light incident on and reflected by the particles 420 of the second encapsulation material 42. More specifically, more light is incident on and reflected by the particles 410 when the majority of the light from the LED chip 30 transmits through the first encapsulation material 41, and less light is incident on and reflected by the particles 420 when the minority of light from the LED chip 30 transmits through the second encapsulation material 42. The light reflected by the particles 410, 420 emits towards different directions, and finally is uniformly emitted through the encapsulation unit 40, to thereby improve a uniformity of brightness of light from the encapsulation unit 40 of the LED 10.

Figure 2:
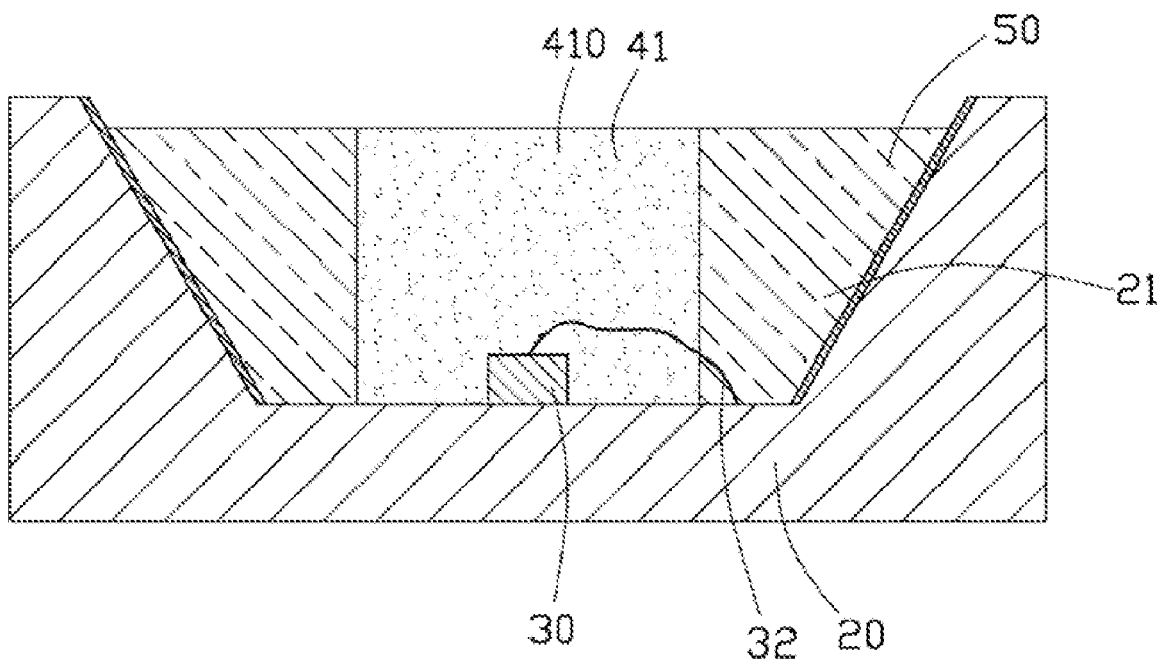
FIG. 2 is a cross-section showing a first method of manufacturing the light emitting diode of FIG. 1.

Referring to FIG. 2, a method for manufacturing the LED 10 includes the following steps. Step 1: providing a substrate 20 with the receiving recess 21 therein, bonding the LED chip 30 to the bottom face of the receiving recess 21 via sliver adhesive and using the gold wire 32 to electrically connect the LED chip 30 and an electrode disposed on the substrate 20. Step 2: providing a first mold 50 which has a same configuration as the second encapsulation material 42, putting the first mold 50 in the receiving recess 21 at a position corresponding to the second encapsulation material 42, and injecting a mixture of a transparent colloid, such as epoxy resin, and a plurality of particles 410, such as fluorescent powders, into a remaining space of the receiving recess 21 that is not occupied by the first mold 50. The remaining space is formed by a central through hole of the first mold 50 in the receiving recess 21. The first encapsulation material 41 is formed after the mixture of the transparent colloid and the particles 410 is solidified. Step 3: removing the first mold 50, and injecting another mixture of a transparent colloid, such as epoxy resin, and a plurality of particles 420, such as fluorescent powders, into a space formed in the receiving recess 21 by the removed first mold 50. The second encapsulation material 42 is formed after the another mixture of the transparent colloid and the particles 420 is solidified in the space.

Figure 3:
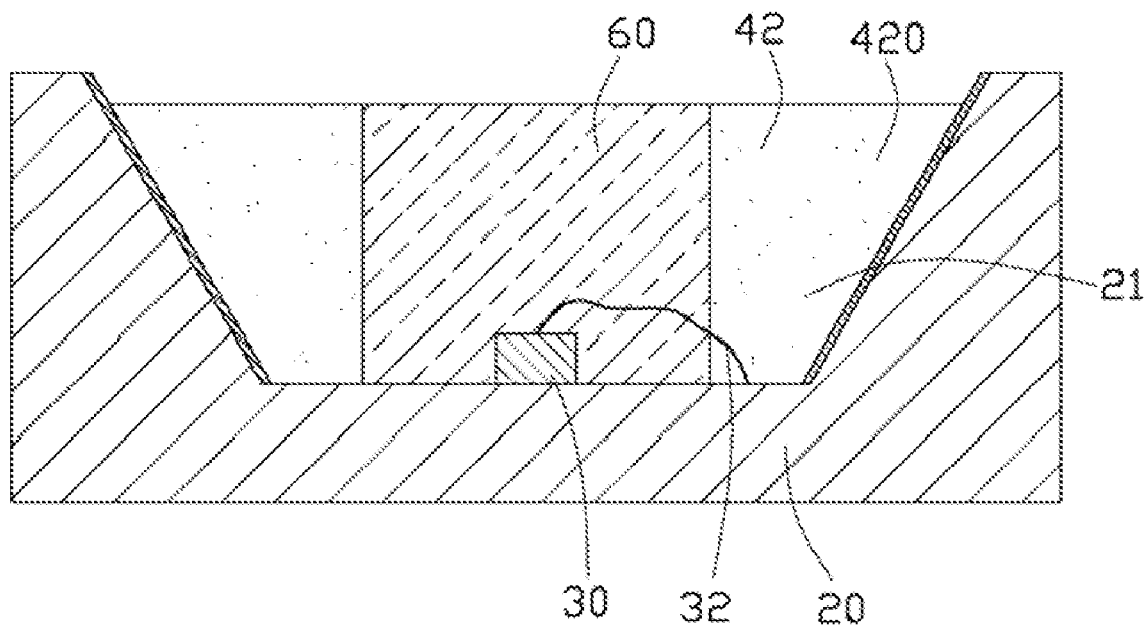
FIG. 3 is a cross-section showing a second method of manufacturing the light emitting diode of FIG. 1.

In this method of manufacturing the LED 10, the first encapsulation material 41 of the encapsulation unit 40 is formed earlier than the second encapsulation material 42. In fact, the second encapsulation material 42 of the encapsulation unit 40 can be formed earlier than the first encapsulation material 41. Referring to FIG. 3, another method for manufacturing the LED 10 includes the following steps. Step 1: providing a substrate 20 with the receiving recess 21 therein, bonding the LED chip 30 to the bottom face of the receiving recess 21 via sliver adhesive and using the gold wire 32 to electrically connect the LED chip 30 with an electrode disposed on the substrate 20. Step 2: providing a second mold 60 which has a same configuration as the first encapsulation material 41, putting the second mold 60 in the receiving recess 21 at a position corresponding to the first encapsulation material 41, and injecting a mixture of a transparent colloid, such as epoxy resin, and a plurality of particles 420, such as fluorescent powders, into a remaining space of the receiving recess 21 that is not occupied by the second mold 60. The remaining space is formed by the receiving recess 21 around the second mold 60. The second encapsulation material 42 is thus formed after the mixture of the transparent colloid and the particles 420 is solidified. Step 3: removing the second mold 60, and injecting another mixture of a transparent colloid, such as epoxy resin, and a plurality of particles 410, such as fluorescent powders, into a space formed in the receiving recess 21 by the removed second mold 60. The first encapsulation material 41 is formed after the another mixture of the transparent colloid and the particles 410 is solidified in the space.

Alternatively, the shape of the first encapsulation material 41 can be varied. An only requirement is that the first encapsulation material 41 is located just over to the LED chip 30 such that the majority of light from the LED chip 30 is transmitted through the first encapsulation material 41 when the light from the LED chip 30 transmits through the encapsulation unit 40, and the distributing density of the particles 410 of the first encapsulation material 41 is lager than that of the particles 420 of the second encapsulation material 42.

Figure 4:
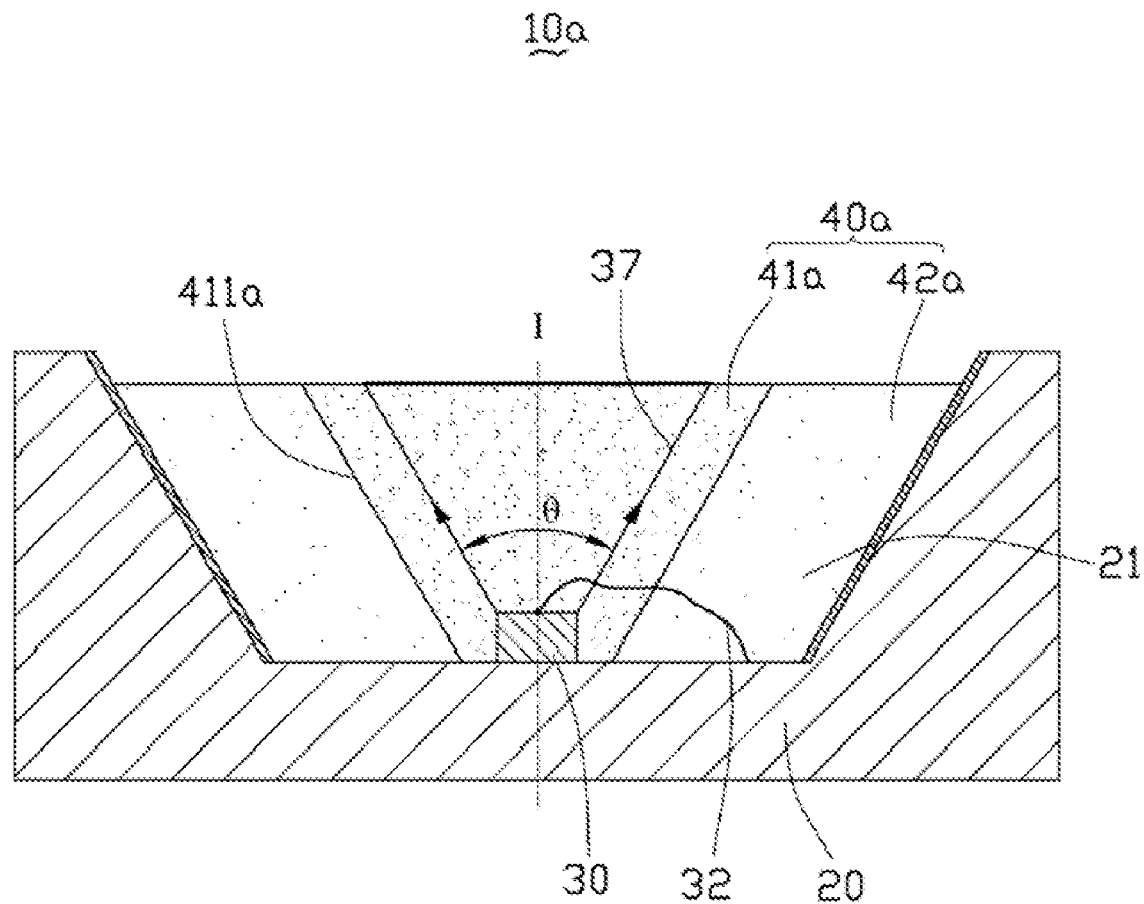
FIG. 4 is a cross-section of a light emitting diode in accordance with a second exemplary embodiment of the present invention.

FIG. 4 shows a second embodiment of the LED 10a. The difference between the second embodiment and the previous first embodiment is: the first encapsulation material 41a of the encapsulation unit 40a is in the form of an inverted truncated cone. A slope of a generatrix 411a of the inverted truncated cone equals to the slope of an outermost light 37 with the central radiation angle θ of the LED chip 30. The generatrix 411a of the first encapsulation material 41a is located at an outer side of the outermost light 37, such that the majority of light from the LED chip 30 is transmitted through the first encapsulation material 41a. The second encapsulation material 42a is located around the first encapsulation material 41a. The second encapsulation material 42a and the first encapsulation material 41a cooperatively form the encapsulation unit 40a which has the same configuration as the receiving recess 21.

Alternatively, the particles 410, 420 are not limited to the fluorescent powders. For example, the particles 410, 420 can be nano-particles of gold or light diffusing particles. More specifically, the light diffusing particles can be inorganic light diffusing powders such as titanium dioxide ($TiO_2$) dust and nano-silicon dioxide ($SiO_2$) particles, or organic light diffusing powders such as polymethylmethacrylate particles and polystyrene sphere particles.

It is to be understood that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode comprising:
   a substrate;
   a light emitting diode chip mounted on the substrate; and
   an encapsulation unit disposed on the substrate and encapsulating the light emitting diode chip, the encapsulation unit comprising a first encapsulation material located over the light emitting diode chip and a second encapsulation material encircling the first encapsulation material, a plurality of first particles with a first distributing density being distributed in the first encapsulation material, a plurality of second particles with a second distributing density being distributed in the second encapsulation material;
   wherein the first distributing density is larger than the second distributing density, a central portion of light from the light emitting diode chip transmits through the first encapsulation material and exits the encapsulation unit via a top surface of the first encapsulation material, and a periphery portion of light from the light emitting diode chip transmits through the second encapsulation material and exits the encapsulation unit via a top surface of the second encapsulation material.

2. The light emitting diode of claim 1, wherein a particle diameter of each of the first and second particles is equal to or larger than a wavelength of the light from the light emitting diode chip.

3. The light emitting diode of claim 1, wherein the first and second particles are fluorescent powders.

4. The light emitting diode of claim 1, wherein the substrate defines a receiving recess therein, the receiving recess being bowl-shaped, the light emitting diode chip mounted on a bottom face of the receiving recess, both of the first encapsulation material and the second encapsulation material being received in the receiving recess.

5. The light emitting diode of claim 1, wherein the first encapsulation material is column-shaped, and a diameter of the first encapsulation material is equal to a diameter of a light spot which is defined by the central portion of light from the light emitting diode chip.

6. The light emitting diode of claim 1, wherein the first encapsulation material is in the form of an inverted truncated cone.

7. The light emitting diode of claim 1, wherein the first and second particles are nano-particles of gold.

8. The light emitting diode of claim 1, wherein the first and second particles are light diffusing particles.

9. The light emitting diode of claim 1, wherein the second encapsulation material contacts a circumferential surface of the first encapsulation material, the top surface of the first encapsulation material and the top surface of the second encapsulation material being coplanar.

10. The light emitting diode of claim 4, wherein both the top surface of the first encapsulation material and the top surface of the second encapsulation material are exposed in a top opening of the receiving recess.

11. The light emitting diode of claim 5, wherein the central portion of light is confined within a central radiation angle of the light from the light emitting diode chip, and the central radiation angle is defined between left 30° and right 30° with respect to a central axis of the light emitting diode chip.

12. The light emitting diode of claim 6, wherein the central portion of light is confined within a central radiation angle of the light from the light emitting diode chip, and the central radiation angle is between left 30° and right 30° with respect to a central axis of the light emitting diode chip.

* * * * *